United States Patent [19]

Ohara

[11] 4,347,523
[45] Aug. 31, 1982

[54] LASER RECORDER
[75] Inventor: Yuji Ohara, Asaka, Japan
[73] Assignee: Fuji Photo Film Co., Ltd., Kanagawa, Japan
[21] Appl. No.: 256,468
[22] Filed: Apr. 22, 1981
[30] Foreign Application Priority Data Apr. 24, 1980 [JP] Japan .................................. 55/54608

[51] Int. Cl.³ .......................................... G01D 15/14
[52] U.S. Cl. .................................... 346/108; 358/298
[58] Field of Search ............................ 346/76 L, 108; 358/296–300, 302, 283; 369/124

[56] References Cited
U.S. PATENT DOCUMENTS 3,725,574 4/1973 Gast ................................. 346/108 X
4,001,492 1/1977 Suzuki et al. .................... 358/298 X

FOREIGN PATENT DOCUMENTS 55-102966 8/1980 Japan ................................... 358/298

OTHER PUBLICATIONS

IBM Technical Disclosure Bulletin, vol. 18, No. 3, "Adaptive Contrast Ranging for Images," Wong, Aug. 1975, pp. 914–917.

Primary Examiner—L. T. Hix
Assistant Examiner—W. J. Brady
Attorney, Agent, or Firm—Sughrue, Mion, Zinn, Macpeak & Seas

[57] ABSTRACT

A laser recorder using a semiconductor laser which is capable of reproducing an image such as a picture having half-tones with high quality. An input signal is sampled and converted to a digital number which is used to address a read-only memory in which is stored pulse numbers with corresponding pulse width selection numbers. The outputs of the read-only memory are compared with the output of a counter circuit to determine the number of pulses which are applied to a laser beam modulator. A plurality of modulating pulses are produced, each having a different width. One of these is selected as the modulating signal in accordance with the selection bits stored in the read-only memory.

10 Claims, 8 Drawing Figures

LASER RECORDER

BACKGROUND OF THE INVENTION

The present invention relates to a laser recorder using a semiconductor laser which is capable of reproducing an image such as a picture having half-tones with a high quality.

In intensity-modulating a laser beam for recording an image having half-tones (hereinafter referred to as "a half-tone image" when applicable), any of (1) a technique of using an ultrasonic optical modulator, (2) a technique of varying the discharge current of a gas laser, and (3) technique of varying the current of a semiconductor laser may be employed.

The first technique is disadvantageous in that it is expensive and requires an intricate construction because of the need for an expensive ultrasonic optical modulator and a fine adjustment mechanism for matching the Bragg angles of the modulator.

The second technique is also disadvantageous in that the modulating frequency is in a low frequency band of the order of several hundreds of Hertz and the service life of the laser tube is reduced by varying the discharge current.

The third technique suffers from the drawback that since the optical output vs. current characteristic curve of the semiconductor laser is as shown in FIG. 1, the optical output is greatly varied merely by slightly changing the input current. Therefore it is considerably difficult to record a half-tone image by controlling the optical output in an analog mode by varying the input. However, the semiconductor laser is advantageous in that it can be subjected to binary modulation with a high frequency signal and therefore it can be used for optical communication.

A method wherein an input signal is sampled with a sampling pulse, and a high frequency pulse signal having a frequency of at least 10 Hz is produced using the sampling pulse so that the number of high frequency pulses outputted in each sampling period is controlled according to a semiconductor laser thereby to record a half-tone image (hereinafter referred to as "a pulse number modulation method" when applicable) and a method wherein a pulse width modulation signal having a pulse width corresponding to the number of high frequency pulses is applied to a semiconductor laser to record a half-tone image (hereinafter referred to as "a pulse width modulation method" when applicable) have been disclosed In U.S. patent application Ser. No. 214,815 filed Dec. 9, 1980 (corresponding to Japanese patent application No. 168565/1979) filed by the present applicant.

An object of the invention is to provide a laser recorder which can reproduce a half-tone image with high accuracy by the utilization of the binary modulation capability of the semiconductor laser.

The term "sampling pulse" as herein used is intended to mean a pulse for sampling an input video signal at predetermined time intervals. The frequency of the sampling pulse can be selected as desired. However, it is preferable that it be slightly higher than the maximum frequency of the video signal in order to reproduce the image with a high resolution. Furthermore, the term "high frequency pulse" is intended to mean a pulse having a frequency higher than that of the sampling pulse mentioned above. Preferably, the frequency of the high frequency pulse is several hundred to several thousand times that of the sampling pulse. There two pulses may be generated separately although it is preferable that the sampling pulse be obtained by subjecting the high frequency pulse to frequency division.

The amount of exposure of each of the picture mements which form an image is determined by the pulse width T of a pulse width modulation signal which is applied to a semiconductor laser according to the level of an input video signal during the respective sampling period. In accordance with the invention, the pulse width T corresponds to the number N of high frequency pulses which are outputted during each sampling period. If the pulse width increase required whenever the number of high frequency pulse is increased by one in order to maintain the total amount of disclosure constant (hereinafter referred to as "a unitary pulse" when applicable) is represented by $\Delta t$, then the corresponding pulse width T is:

$$T = N \cdot \Delta t \quad (1)$$

If, when the pulse width modulation signal is at a high "H" logic level, i.e. when the light beam is being applied to a photosensitive material, the light intensity is represented by I, then the total optical energy applied to a picture element, i.e., the exposure E, is defined by the following expression:

$$\begin{aligned} E &= I \cdot T \\ &= I \cdot N \cdot \Delta t \end{aligned} \quad (2)$$

In expression (2), the light intensity I and the unitary pulse width $\Delta t$ are constant, and therefore the exposure E is proportional to the number N of high frequency pulses (hereinafter referred to as "a high-frequency pulse number N" when applicable). If the increment of exposure per high frequency pulse (hereinafter referred to as "a unitary exposure" when applicable) is represented by $\Delta e$, then:

$$\Delta e = I \cdot \Delta t \quad (3)$$

Using, expression (3), expression (2) can be written as the following expression (4):

$$E = N \cdot \Delta e \quad (4)$$

The above description will become more apparent when considered along with FIG. 2.

Next, the relation between high-frequency pulse numbers N and densities of an image recorded in the case where the image is recorded by a semiconductor laser using a pulse width modulation signal having a pulse width corresponding to a high-frequency pulse number will be described with reference to FIG. 3.

In FIG. 3, a curve I is an example of the characteristic curve of a recording material indicating the logarithm of the exposure amounts E with density, and a curve II is an example of the relation between the numbers N of high frequency pulses and the logarithms of exposure amounts E of the recording material which are determined from expression (4).

In FIG. 3, once a density level has been selected, the corresponding high-frequency pulse number N can be obtained by following the arrow. When the density level D is changed from 0.1 to 0.2 in the low density range, the high-frequency pulse number N increases by only about nine. However, when the density level D is changed from 1.3 to 1.4 in the high density range, the high-frequency pulse number N increases by about fifty pulses.

As is apparent from the above description, in order to reproduce the gradations of an image with a sufficiently high accuracy at equal density intervals, the frequency of the high frequency pulse must be much higher than that of the sampling pulse, for instance, several hundred times or, if necessary, several thousand times.

The relation of the sampling pulse frequency $f_s$, the high-frequency pulse frequency $f_H$, and the maximum level of the input signal, i.e., the maximum pulse number $N_{max}$ which is required for the level of the input signal to which the maximum exposure corresponds is:

$$f_H > \geq N_{max} \times f_s \tag{5}$$

The maximum pulse number $N_{max}$ will be larger than the values specified in FIG. 3 if the density intervals are sufficiently small to reproduce the image with a high accuracy or for certain ranges of the characteristic of the photosensitive material such as $\gamma$ (the maximum gradient of the characteristic curve) and a range of density D. As a result, the high-frequency pulse frequency is greatly increased making it difficult to provide circuitry implementing the above-described modulation method.

By way of examples, if the sampling frequency $f_s = 100$ KHz, and the maximum pulse number $N_{max} = 500$, the corresponding necessary high-frequency pulse frequency $f_H$ is:

$$f_H \geq N_{max} \times f_s = 50 \text{ MHz}.$$

Accordingly, a circuit for practicing the above-described modulation method cannot be constructed of standard TTL (transistor-transistor-logic) elements. Thus, the conventional modulation method is disadvantageous in that ECL (emitter-coupled logic) elements or the like must be used to implement the circuit and hence the circuit has a considerably high manufacturing cost.

SUMMARY OF THE INVENTION

In accordance with the invention, the high frequency $f_H$ is reduced to a half of the high frequency used with the conventional method or lower without lowering the exposure level resolution of the picture elements, i.e., the reproduction density resolution, with the result that the circuit manufacturing cost is reduced.

A specific feature of the invention is the provision of a laser recorder in which an input signal is sampled with a sampling signal, a high frequency pulse signal whose frequency is higher than that of the sampling signal is generated with the number of high frequency pulses thus generated during a predetermined sampling time being controlled according to the level of the input signal, and a light beam is subjected to binary modulation with a pulse width modulation signal having a pulse width corresponding to the number of high frequency pulses. Further, according to the invention, a fundamental pulse width modulation signal having a pulse width corresponding to the number of high frequency pulses is delayed to provide a plurality of delayed pulse width modulation signals of different delay times. A plurality of composite pulse width modulation signals are obtained from the logic sum or logic product of the fundamental pulse width modulation signal and at least two of the plurality of delayed pulse width modulation signals, and one of the fundamental pulse width modulation signal and composite pulse width modulation signal is selectively employed for every sampling period.

DESCRIPTION OF THE PREFERRED EMBODIMENTS

Figure 5:
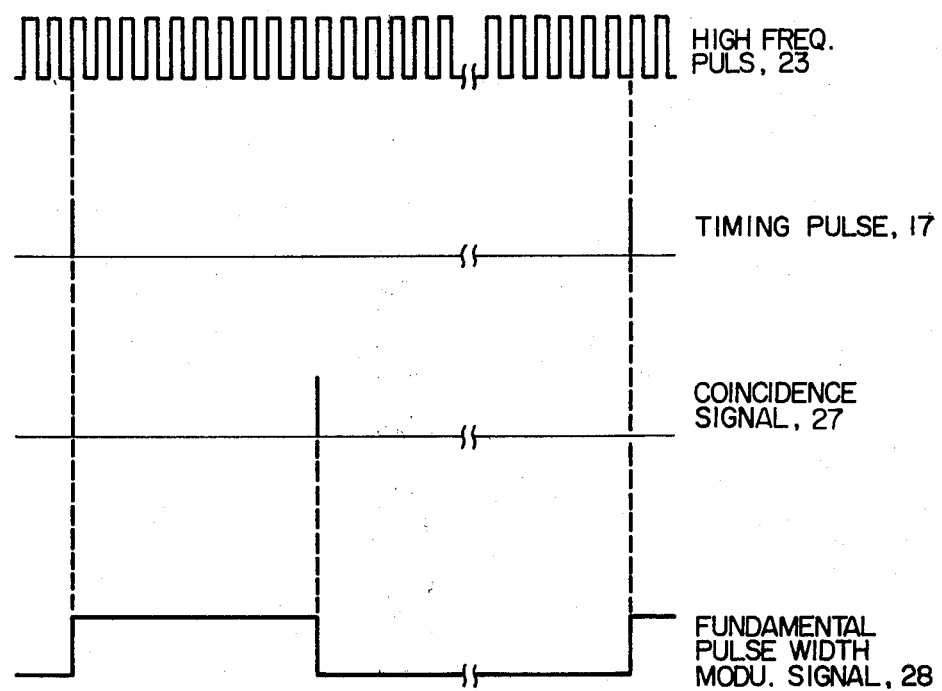
FIGS. 5 and 6 are timing charts for a description of the operation of the laser recorder shown in FIG. 4.
Figure 6:
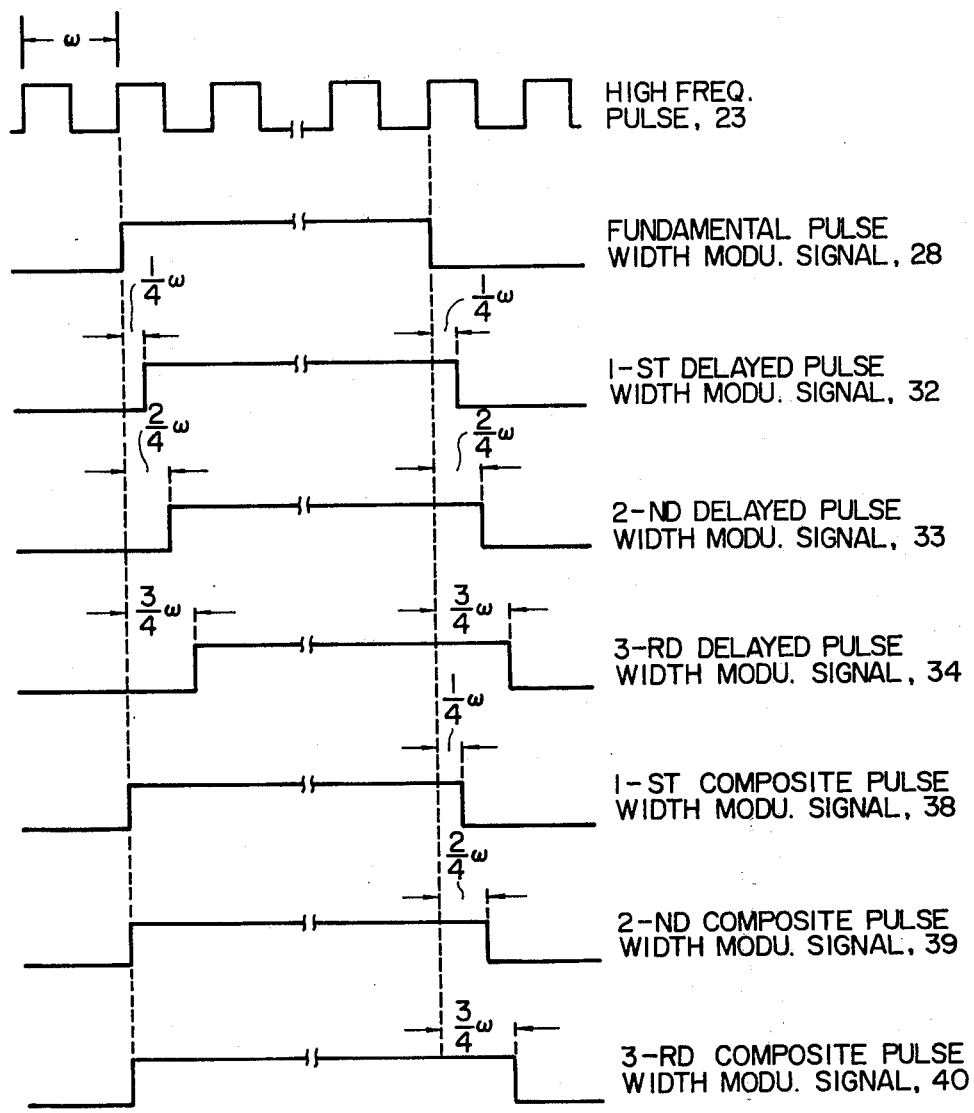

A preferred embodiment of a laser recorder according to the invention will be described with reference to FIGS. 4 through 6.

Figure 4:
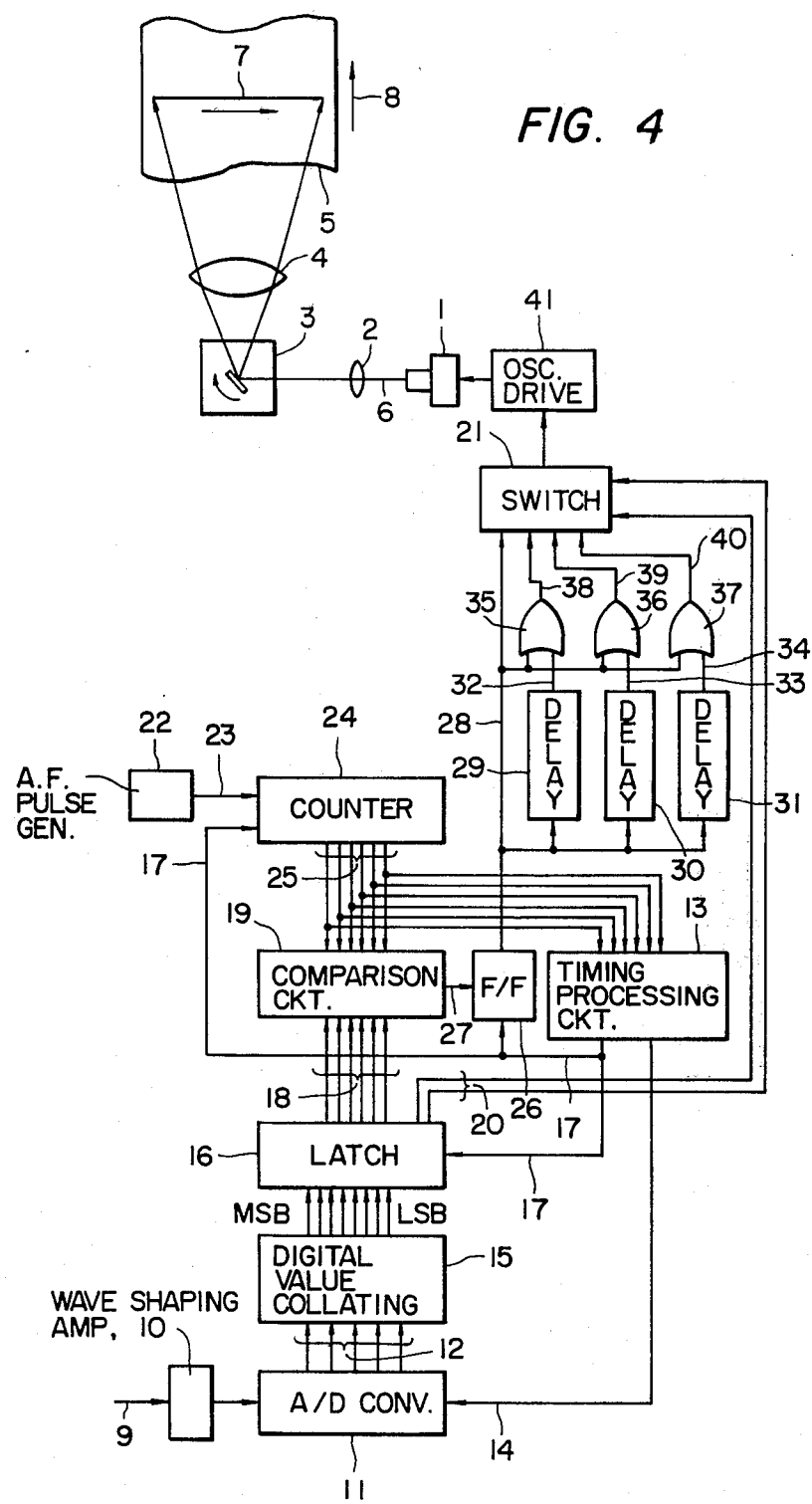
FIG. 4 is a block diagram showing a preferred embodiment of a laser recorder according to the invention.

FIG. 4 is a block diagram showing a laser recorder according to the invention. In FIG. 4, reference numeral 1 designates a semiconductor laser oscillator, 2 a laser beam shaping lens, 3 a deflector, 4 a focusing lens, and 5 a recording sheet. It is desirable that the recording sheet 5 be a silver salt or electronic type which is capable of producing half-tones and which is sensitive to the wavelength (red or infrared) of the semiconductor laser beam. A semiconductor laser beam which is current-pulse-modulated is collimated by the beam shaping lens 2, deflected by the deflector 3, and formed into a light spot having a predetermined size by the focusing lens 4. The laser beam 6 thus processed is used to perform the main scanning to trace scanning lines 7 on the recording sheet. Auxiliary scanning is achieved by moving the recording sheet 5 in the direction of the arrow 8. In the described embodiment, the deflector 3 is a galvanometer.

A technique of modulating the semiconductor laser will be described. A semiconductor laser can be modulated with a pulse signal of a high frequency up to several hundreds of megahertz. Utilizing high frequency pulse modulation, the quantity of light can be controlled according to the number of pulses applied to the laser whereby half-tone recording can be achieved with a high precision. An example of such pulse modulation will be described with reference to FIG. 4. An inputted video signal 9 is amplified to a predetermined level by a waveform shaping amplifier 10. The video signal 9 is, for instance, a received facsimile signal which represents the density of an original picture.

The input signal thus waveform-shaped is applied to an A/D (analog-to-digital) converter 11 where it is quantized into a 5-bit digital signal 12. The A/D converter 11 operates to perform a conversion operation upon receipt thereat of a sampling pulse 14 provided by a timing processing circuit 13. The digital signal is held until the next sampling pulse is applied. The digital signal 12 is applied to a digital value collating circuit 15. The digital value collating circuit 15 operates to output the number N of high frequency pulses corresponding to a pulse width T which provides an exposure E which is determined in accordance with the level of the input signal, i.e., the density level D of the original picture as described with reference to FIG. 3. The circuit 15 may be implemented by, for instance, a PROM (programmable read-only memory). The bits of the quantized input signal 12 are applied as an address signal to the circuit 15 in response to which the circuit 15 outputs in the format of 8-bit data the number N of high frequency pulses which stored at the input address.

In the embodiment described, the signal from a facsimile transmitter corresponds to the logarithm density of an original picture. However, if the signal is not logarithm-transformed, the logarithm transformation function may be performed by the digital value connecting circuit 15.

The 8-bit data outputted by the digital value collating circuit 15 is applied to a latch circuit 16 and is latched thereby at the time of receipt a timing pulse 17 from the timing processing circuit 13. Of the 8-bit data representative of the number N of high frequency pulses which is outputted by the digital value collating circuit 15 and latched by the latch circuit 16, the six highest order bits 16 are applied to one input port of a comparison circuit 19 and while the remaining bits 20 are applied to a switching circuit 21 (described below). A counter circuit 24 operates to count the number of high frequency pulses 23 which are generated by a high frequency pulse generator 22. The output count value 25 of the counter circuit 24 is applied to the other input port of the comparison circuit 19. The output count value 25 is further applied to the timing processing circuit 13 which produces the above-described sampling pulse 14 and timing pulse according to the count value 25. The timing pulse signal 17 is applied to the clear terminal of the counter circuit 24. The timing pulse signal 17 is further applied to the set terminal of a flip-flop circuit 26 to set the latter 26.

The comparison circuit 19 compares the 6-bit data 18 applied to the one input port thereof with the count value 25 of the counter circuit 24. When the two values coincide, a coincidence signal 27 is outputted to reset the flip-flop circuit 26 in response to which the circuit 26 outputs a fundamental pulse width modulation signal 28. FIG. 5 is a timing chart showing the relation of the above-described high frequency pulse 23, timing pulse 17, coincidence signal 27 and fundamental pulse width modulation signal 28.

The fundamental pulse width modulation signal 28 outputted by the flip-flop circuit 26 is applied to first, second and third delay circuits 29, 30 and 31, where the fundamental pulse width modulation signal 28 is delayed by ¼ω, 2/4ω and ¾ω, where ω is the period of the high frequency pulse 23, to provide first, second and third delayed pulse width modulation signals 32, 33 and 34, respectively.

The first, second and third delayed pulse width modulation signals 32, 33 and 34 are applied to first input terminals of first, second and third OR circuits 35, 36 and 37 to the second input terminals of which the fundamental pulse width modulation signal 28 is applied. As a result, the OR circuits 35, 36 and 37 output first, second and third composite pulse width modulation signals 38, 39 and 40, respectively. The fundamental pulse width modulation signal 28 and the first, second and third composite pulse width signals 38, 39 and 40 are supplied to the switching circuit 21 where one of the signals 28, 38, 39 and 40 is selected according to the state of the 2-bit data 20 outputted by the digital value converting circuit 15 and stored by the latch circuit 16. The composite pulse width modulation signal thus selected is applied to a semiconductor laser oscillator driving circuit 41 to subject the semiconductor laser oscillator 1 to pulse width modulation. The relations of the above-described various pulse width signals will become more apparent from FIG. 6.

Figure 7:
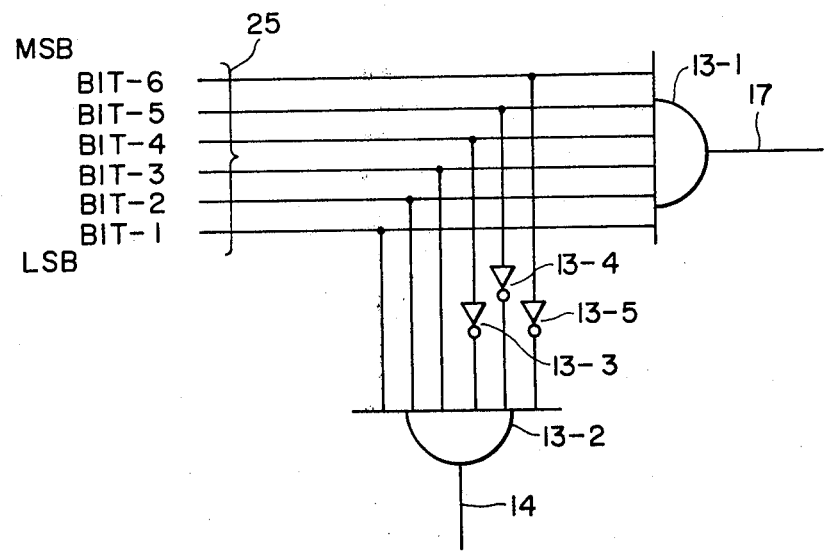
FIG. 7 is a diagram of the timing processing circuit.

The timing processing circuit 13 indicated in FIG. 4 will be described in more detail with reference to FIGS. 7 and 8. As shown in FIG. 7, this circuit includes AND gates 13-1 and 13-2 and inverters 13-3, 13-4 and 13-5.

Figure 8:
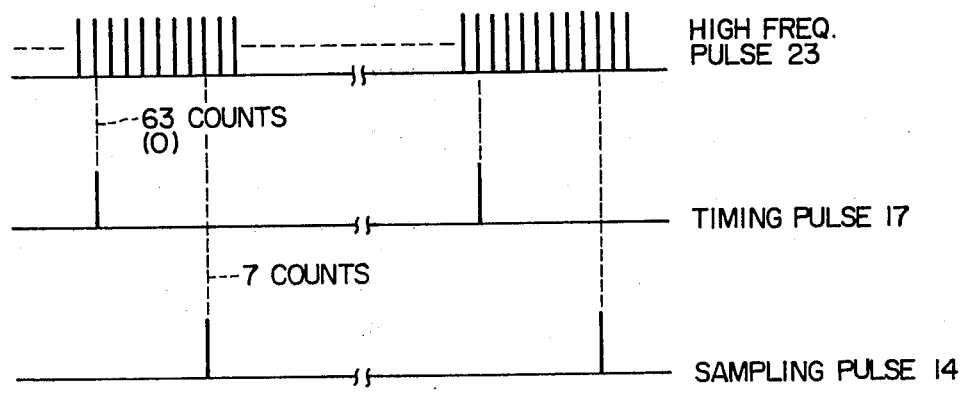
FIG. 8 is a timing chart of the circuit of FIG. 7.

FIG. 8 is a timing chart for a description of the timing processing circuit shown in FIG. 7. The count value 25 outputted from the counter circuit 24 is applied to the AND gate 13-1 and a timing pulse 17 is generated therefrom when the count value 25 reaches 63. In response to the timing pulse 17 thus produced, new data is latched by the latch circuit 16, and simultaneously the counter circuit 24 is cleared and the flip-flop 26 is set.

On the other hand, the signals bit-1 (LSB), bit-2 and bit-3 outputted from the counter circuit 24 are directly applied to the inputs of the AND gate 13-2 while the remaining counter output signals bit-4, bit-5, bit-6 and bit-7 (MSB) are applied thereto through the inverters 13-3, 13-4 and 13-5, respectively. A sampling pulse is generated by the AND gate 13-2 when the count value 25 reaches six. The A/D converter 11 starts the sampling operation in response to the sampling pulse thus produced.

It should be noted that the generation of the sampling pulse takes place after the timing pulse 17 is generated and the operations of the latch circuit 16, the counter circuit 24 and the flip-flop 26 are stabilized. Insofar as this requirement is met, the sampling pulse may be generated at any time if the converting operations of the A/D converter 11 and the digital value collating circuit 15 are completely terminated during the period between the generation of the sampling pulse 14 and the subsequently generated timing pulse 16.

The above-mentioned example of the timing processing circuit 13 is designated so that the sampling pulse 14 is generated at the time when the count value 23 is six.

Figure 1:
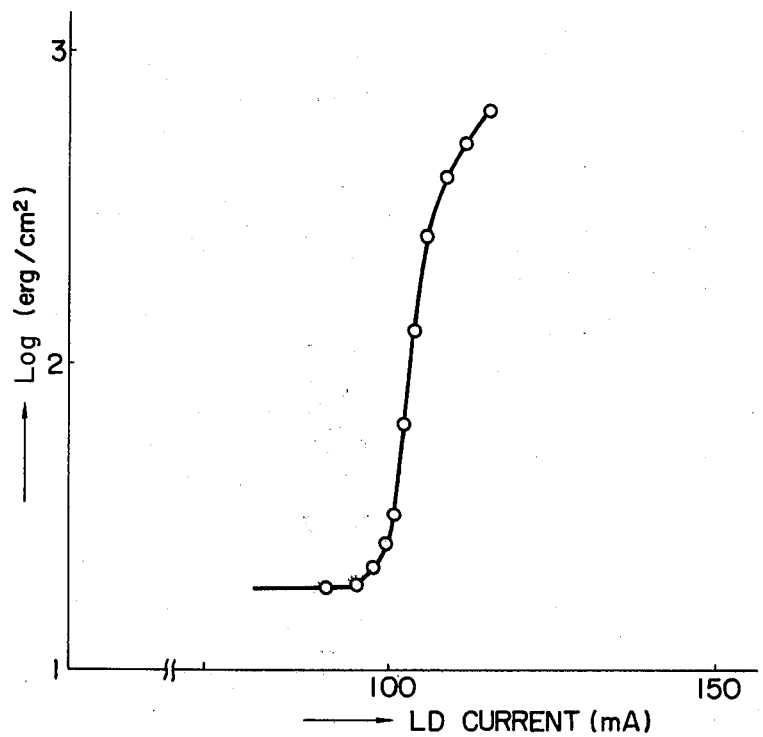
FIG. 1 is a graphical representation indicating the current vs. optical output characteristic curve of a semiconductor laser.
Figure 2:
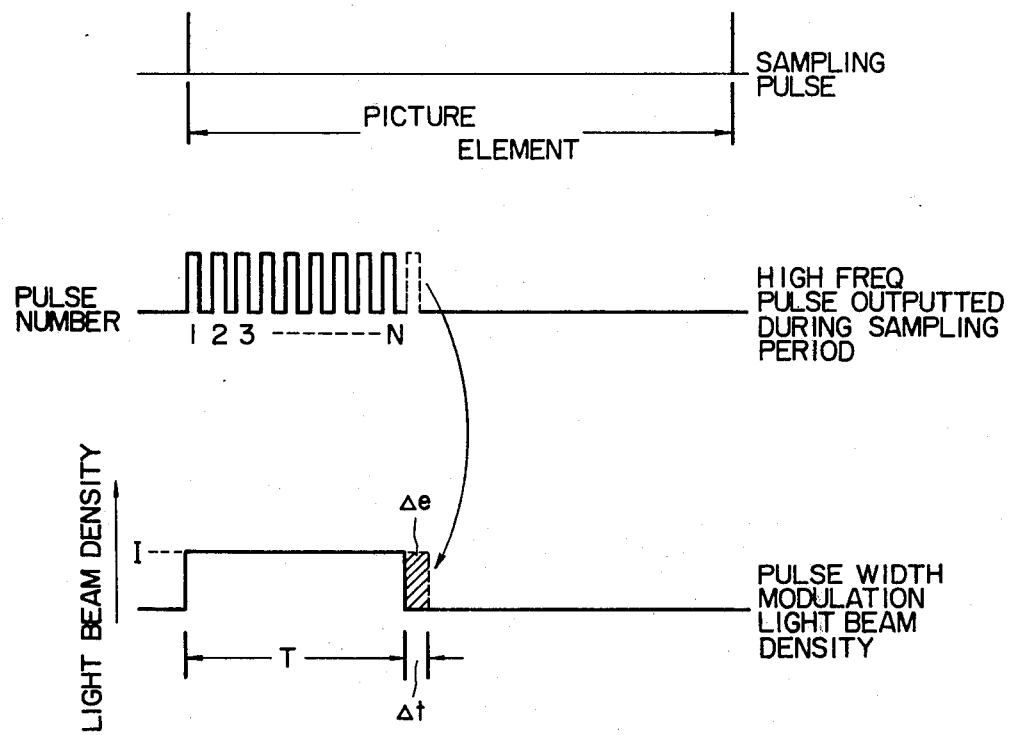
FIGS. 2 and 3 are diagrams for a description of the principle of pulse width modulation which is controlled by the number of high frequency pulses.
Figure 3:
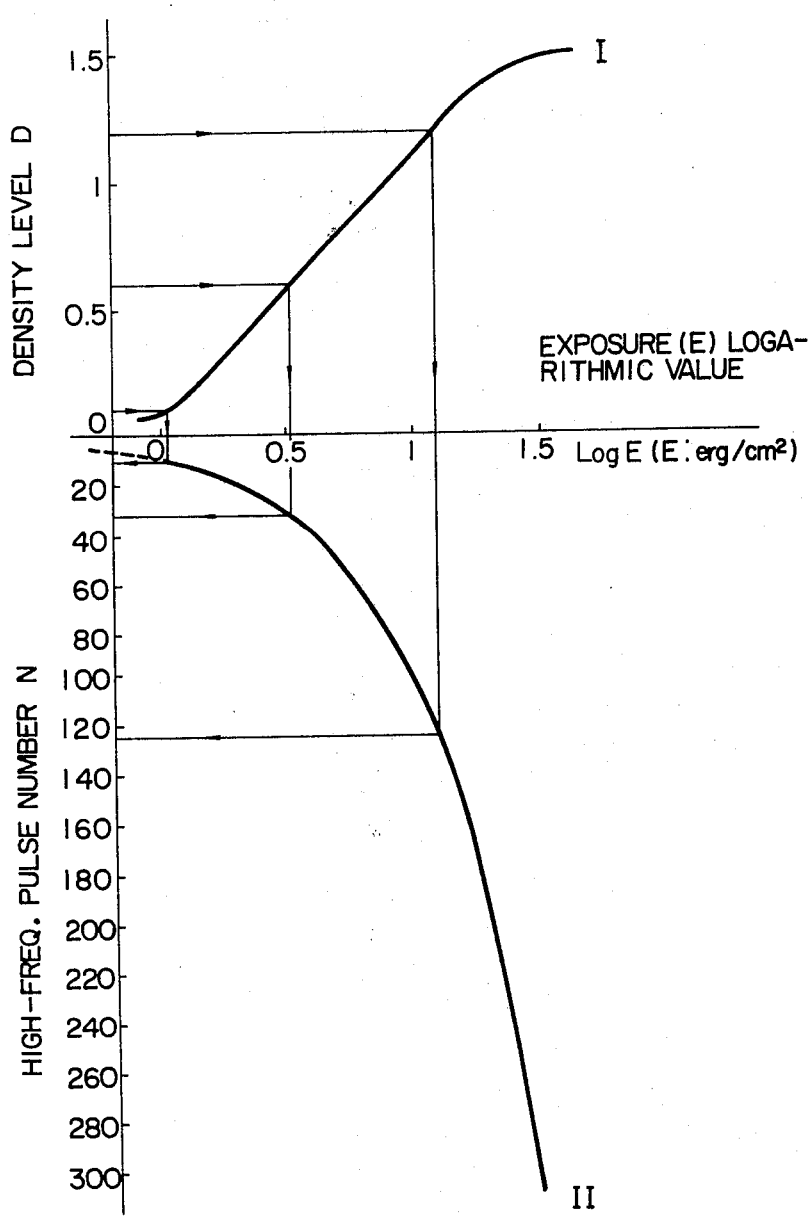

As is clear from the above description, in the preferred embodiment, with respect to each level of the 5-bit digital signal which is obtained by quantizing the input signal 1, the number of high frequency pulses corresponding to the pulse width T which provides the theoretically required exposure amount E, as described with reference to FIG. 3, is provided as the 8-bit data. The data 18 composed of the six highest order bits of the 8-bit data is compared with the count value 25 of the high frequency pulses 23 to produce the fundamental pulse width modulation signal 28. Furthermore, the data 20 composed of the remaining two bits is used to select one of the fundamental pulse width modulation signal 28 and the first, second and third composite pulse width modulation signals 38, 39 and 40, whereby the pulse width T of the pulse width modulation signal, i.e., the exposure amount of each picture element is controlled substantially with 8-bit resolution.

According to the conventional method disclosed in U.S. patent application Ser. No. 214,815 (corresponding to Japanese patent application No. 168565/1979), in order to provide 8-bit resolution, from expression (5) above, the frequency $f_H$ of the high frequency pulse signal should be:

$$f_H \geq N_{max} \times f_s$$
$$= 2^8 \times f_s.$$

On the other hand, with the invention, the frequency $f_H$ is:

$$f_H \geq 2^6 \times f_s.$$

That is, the frequency $f_H$ with the invention is one-fourth that needed with the conventional method.

More specifically, if the sampling frequency $f_s = 200$ KHz, then the frequency $f_H$ used in the conventional method is:

$$f_H \geq 2^8 \times 200 \text{ KHz} = 51.2 \text{ MHz}.$$

Accordingly, considerably expensive ECL elements must be used instead of standard TTL elements of much lower price in order to form the required circuits.

On the other hand, with the invention, the value of $f_H$ is:

$$f_H \geq 2^6 \times 200 \text{ KHz} = 12.8 \text{ MHz}.$$

Accordingly, the circuit shown in FIG. 4 can be readily implemented usng standard TTL elements.

Thus, a laser recorder of low manufacturing cost which uses a semiconductor laser capable of reproducing a half-tone image with a high accuracy can be realized according to the invention.

While the invention has been described by using specific assumed numerical data, the invention is not limited thereto or thereby. In addition, the OR circuits 35, 36 and 37 in FIG. 4 can be replaced by AND circuits while retaining the same effect.

What is claimed is:

1. A laser recorder comprising: means for sampling an input signal with a sampling signal; means for producing a high frequency pulse signal having a frequency higher than the frequency of said sampling signal; means for outputting a number of high frequency pulses from said high frequency pulse signal in a predetermined sampling period according to a level of said input signal; means for producing a fundamental pulse width modulation signal having a pulse width corresponding to said number of high frequency pulses; means for delaying said fundamental pulse width modulation signal to provide a plurality of delayed pulse width modulation signals of different delay times, means for forming a plurality of composite pulse width modulation signals as logic operations of said fundamental pulse width modulation signal and at least two of said plurality of delayed pulse width modulation signals; means for selecting one of said fundamental pulse width modulation signal and composite pulse width modulation signals for every sampling period; and means for binary modulating a laser light beam in response to the selected one of said fundamental pulse width modulation signal and said composite pulse width modulation signals.

2. The laser recording of claim 1 wherein said sampling means comprises an analog-to-digital converter.

3. The laser recorder of claim 1 or 2 wherein said means for outputting a number of high frequency pulses comprises means for storing pulse numbers, said storing means having address inputs coupled to digital outputs of said analog-to-digital converter, said storing means additionally storing at least one selection bit for each said pulse number corresponding to the selected one of said fundamental pulse width modulation signal and said composite pulse width modulation signals.

4. The laser recorder of claim 1 wherein said delaying means comprises a plurality of separate delay circuits having inputs coupled in common.

5. The laser recorder of claim 1 wherein said logic operations comprise logic sum operations.

6. The laser recorder of claim 1 wherein said logic operations comprise logic product operations.

7. A laser recorder comprising: an analog-to-digital converter, an input signal coupled to an analog input of said analog-to-digital converter; a read-only memory having address inputs coupled to digital outputs of said analog-to-digital converter, said read-only memory having stored at each address input thereof a pulse number corresponding to a predetermined value of said input signal and at least one pulse width selection bit for selecting a pulse width of a laser light beam; a pulse generator for producing a continuous stream of pulses; a counter having a clock input coupled to outputs of said pulse generator; a latch having inputs coupled to outputs of said read-only memory; a comparison circuit having a first input port coupled to outputs of said counter and predetermined ones of outputs of said latch; a flip-flop having an input coupled to outputs of said comparison circuit, a fundamental pulse width modulation signal being produced at an output of said flip-flop; a timing processing circuit comprising a first decoder having an input coupled to outputs of said counter for operation of said analog-to-digital converter and a second decoder having inputs coupled to outputs of said counter for resetting said counter and operating said latch; at least one delay means having an input coupled to said output of said flip-flop; at least one logic operation circuit, one of said logic operation circuits being provided for each of said delay means and having a first input coupled to an output of a corresponding one of said at least one delay means and a second input coupled to said output of said flip-flop; switch means for selecting as an output signal one of said output of said flip-flop and outputs of said at least one logic operation circuit in response to outputs of said latch corresponding to said selection bits stored in said read-only memory; means for producing a recording laser beams; and means for modulating said means for producing said semiconductor beam in response to said output of said switch means.

8. The laser recorder of claim 7 wherein a plurality of said delay means and said logic operation circuits are provided.

9. The laser recorder of claim 7 wherein said logic operation circuits comprise OR gates.

10. The laser recorder of claim 7 wherein said logic operation circuits comprise AND gates.

* * * * *